(12) United States Patent
Hamasaki et al.

(10) Patent No.: US 6,449,296 B1
(45) Date of Patent: Sep. 10, 2002

(54) SEMICONDUCTOR LASER DEVICE

(75) Inventors: Hiroshi Hamasaki, Hiratsuka; Hideto Furuyama, Yokohama, both of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 155 days.

(21) Appl. No.: 09/606,014

(22) Filed: Jun. 29, 2000

(30) Foreign Application Priority Data

Jun. 30, 1999 (JP) ............................................ 11-186552

(51) Int. Cl.[7] .............................................. H01S 5/022
(52) U.S. Cl. ........................ 372/36; 372/29.011; 372/50
(58) Field of Search .................... 372/36, 50, 29.011, 372/29.01

(56) References Cited

U.S. PATENT DOCUMENTS 5,883,913 A * 3/1999 Doi et al. ...................... 373/50
5,920,587 A * 7/1999 Narui et al. ................... 372/50

FOREIGN PATENT DOCUMENTS

| JP | 4-155983 | 5/1992 |
| JP | 5-315700 | 11/1993 |

* cited by examiner

*Primary Examiner*—James Davie
(74) *Attorney, Agent, or Firm*—Oblon, Spivak, McClelland, Maier & Neustadt, P.C.

(57) ABSTRACT

A semiconductor laser device including a mounting body having a step including an upper level, a lower level and an inclined plane provided between the upper and lower levels; and a semiconductor laser element mounted on the lower level, the mounting body further having a pin-type photodiode including a region of a first conduction type, and i-type region and a region of a second conduction type, a portion of laser beam emitted from the laser element being reflected by the inclined plan and output therefrom, a reminder of the laser beam emitted from the laser element being incident into the mounting body through the inclined plane and detected by the photodiode, the i-type region of the photodiode being provided on the inclined plane so that a major part of the remainder of the laser beam can enter the i-type region without passing the region of a first conduction type and the region of a second conduction type of the photodiode.

25 Claims, 5 Drawing Sheets

SEMICONDUCTOR LASER DEVICE

BACKGROUND OF THE INVENTION

The present invention relates to a light source used in optical communications, optical transfer technology, and optical information storage technology.

Semiconductor lasers are widely use nowadays as light sources infields such as optical communications, optical data transfer, and optical information storage, because of the coherency of the light radiated therefrom, the possibility of high-speed operation, or their extremely small size.

A semiconductor laser is mounted on a metal component such as a lead frame or metal block, for various reasons such as to ensure a thermal path way because optical output varies subtly with temperature change during the emission of light that has been stimulated by the injection of a current from an external source. However, to mitigate differences in the coefficients of thermal expansion of the metal and the semiconductor material of the semiconductor laser, the laser is first mounted on a mounting body called a "submount" made of a material such as Si or AlN, before being mounted on the metal component.

A semiconductor laser comprises a resonator which has a pair of reflective mirrors and a medium with amplification ratio of at least 1 therebetween. An edge-emitting type of semiconductor laser has become more popular because cleaved facet planes of the crystal can be utilized for the reflective mirrors of the resonator and because the distance through the amplification medium can be easily increased.

On the other hand, it is possible to create a highly reflective mirror using a multi-layer structure of semiconductors and dielectric materials, or the like, and thus implement a surface-emitting laser that emits light in the normal-vector direction of the substrate. However, the technology required for this implementation is not yet sufficient and there are still technical problems to be solved. For example, the surface-emitting laser is still only at the research stage for some materials that is necessary to realize the required wavelength of emitted light. This is why most of the semiconductor laser light sources used in manufactured products are of the edge-emitting type.

When an edge-emitting semiconductor laser is mounted on a mounting body, however, problems such as those described below occur. An active region of the semiconductor laser can be used as a wave-guide structure having an extremely small cross-section, to increase the amplification efficiency and thus prevent losses due to the leakage of light from the amplification region, but this will cause diffraction of the light beam emitted from the end facet so that it expands.

In general, since it is possible to use crystal growth techniques or the like to form a thin region of wavelength order of magnitude in the direction perpendicular to the element substrate, light can be confined into a region of wavelength order of magnitude. In a direction parallel to the substrate, on the other hand, it is difficult to confine light within the wavelength order of magnitude because the confining region is formed of a planar structure, and the confining is also done within a region that is broader than the wavelength, even though that prevents any rise in the element resistance.

For that reason, the angle of diffraction diverges much more in the perpendicular orientation than in the parallel orientation. The angle of divergences of a light beam in the perpendicular orientation and the horizontal orientation become different.

For example, in the perpendicular orientation the divergence angle is on the order of 30 degrees that subtends $1/e^2$ of the optical intensity on the optical axis. In contrast to this, in the horizontal orientation the divergence angle is approximately 10 degrees that subtends $1/e^2$ of the optical intensity on the optical axis.

When a device is mounted on a flat mounting body, a part of the light beam comes into contact with the mounting surface in the vicinity of the element (such as within a distance of 200 microns when the light-emitting portion has a height of 100 microns from the mounting surface). Thus, the part of the light beam is obstructed, due to reflection, scattering and/or absorption at the mounting surface.

This will have an adverse effect during the connection of an optical fiber to an optical pickup that uses this light beam. It is therefore necessary to use some skill when mounting the device, in order to prevent kicking in the vicinity of the peripheral edge of the mounting body. This makes it necessary to limit the positional relationship between the semiconductor laser and the mounting surface, reducing the degree of freedom of installation.

One method of solving the above problems is proposed in Japanese Patent Application Laid-Open No. H05-315700. That is, a semiconductor laser element is mounted in a recess portion formed in a silicon substrate that acts as a mounting body, and a light beam that has been reflected by a wall surface of the recess portion is extracted as information.

With this configuration, the output light is reflected upward in the vicinity of the semiconductor laser element, in other words, before it diverges greatly, making it possible to extract an output beam that substantially retains its original shape, with little interference from the mounting surface and without having to consider any particular positional relationship with the mounting surface.

The optical output of a semiconductor laser varies subtly with changes in the ambient temperature. For that reason, both the semiconductor laser and the mounting substrate are mounted together on an element that enables temperature control, such as a Peltier cooler.

However, the mounting substrate and the mounting body substrate have a certain thermal capacity despite their small dimensions so, if accurate optical output control is required, the actual output beam is monitored and feed back control is imposed on the driving current circuitry. This is called automatic power control (APC).

In an edge-emitting semiconductor laser, two end facets formed at cleavage planes or the like are used as mirrors, but the output beam that is emitted is symmetrical in the forward-backward direction, provided that the reflectivity of the end facets is not particularly limited. It is possible to configure this APC by using a light-detecting element to monitor the light that is output from the rear, but this reduces the utilization efficiency of the light because the monitored light does not contribute to the signal.

For that reason, a system that requires a higher output or a higher efficiency could employ a method of increasing the utilization efficiency of the light by simply using a dielectric multi-layer film to increase the reflectivity of the end facet at the rear. In such a case, the light emission from the rear that can be used for monitoring is reduced, worsening the S/N ratio and impeding accurate APC.

This makes it necessary to monitor part of the light emitted from the forward end (the signal light), and this control method is called front-monitored APC (hereinafter abbreviated to FAPC). It should be noted, however, that if part of the beam is divided up for the purpose of FAPC, the output beam shape can change, in a similar manner to that of the obstruction of the beam described previously.

To prevent this problem, the previously mentioned Japanese Patent Application Laid-Open No. H05-315700 proposes the structure described below. The configuration, as shown in FIG. 9, is such that a mirror 925 formed on the mounting body 902 is made of a semi-transparent film and a n-type diffusion region 924 is formed behind the mirror 925 by a method such as thermal diffusion. The p-n junction that is formed around the border of the n-type diffusion region 924 acts as a photodiode element to detect the emitted light from the laser diode 901.

This structure ensures that the shape of the light beam that is reflected by the semi-transparent film 925 is emitted substantially unchanged, although the light beam has a reduced intensity. In addition, the formation of a photodiode element in the mounting body makes it unnecessary to add another light-detecting element, reducing the number of components and thus enabling an inexpensive, compact device, from the viewpoints of reducing the cost of the photodiode element and the installation costs involved with positioning it.

Furthermore, it is also possible to integrate an optical head that enables both transmission and reception, by providing another light-detecting element for reception on a flat portion. If the directions of input and output of the light are substantially the same in such a case, the configuration of the input-output system for the optical transfer path becomes simpler, making it preferable to form a surface-incident type of photodiode therewith.

However, the above described prior-art example has a further problem, as discussed below. That is, part of the light beam emitted from the semiconductor laser passes through the semi-transparent film 925 that is formed on the inclined plane and enters a photodiode element region, but part of it is first absorbed at a region (an n-type diffusion region 924 in FIG. 9), where it generates electron-hole pairs that drift approximately the distance of the diffusion length thereof then recombine and disappear.

On the other hand, electron-hole pairs excited by the light that has reached a depletion layer formed by the p-n junction, without being absorbed, travel as far as the anode and cathode, respectively, under the influence of a reverse bias applied from the outer source, to create a photo current.

For that reason, it is necessary to make the optical absorbency of the diffusion region 925 as small as possible, in order to increase the quantum efficiency of the photodiode. Control over the diffusion depth is therefore an important factor in determining the capabilities of the photodiode element. However, if the material of the mounting body substrate is highly light-absorbent at the wavelength of the semiconductor laser light, it is quite difficult to improve the quantum efficiency of the photodiode. For example, in the case of a blue semiconductor laser that oscillates at a wavelength of approximately 400 nm on a mounting body that is made of silicon, as in the prior-art example, approximately 55% of the emitted light is absorbed within a distance of only 0.1 μm in the mounting body, reducing the light entering the depletion region to less than half and thus lowering the quantum efficiency.

A graph of the relative intensity of a transmitted light of wavelengths of 650 nm and 400 nm, incident on silicon, versus depth thereof is shown in FIG. 10A and a graph of the relative transmission power for light of wavelengths of 1300 nm and 780 nm, incident on InP, versus depth thereof is shown in FIG. 10B.

It is clear from these graphs that the relative intensity of the transmitted light decreases more rapidly as the wavelength becomes shorter. Thus, there is a problem in that very slight differences in diffusion depth due to a fluctuation of process factors, such as diffusion temperature of diffusion time, can have a huge effect on quantum efficiency. This is particularly true of an inclined plane that has been processed by a method such as etching, where crystal defects and/or surface roughness caused by the processing act as seeds to facilitate the occurrence of abnormal diffusion, making it more difficult to impose strict control over the diffusion depth.

SUMMARY OF THE INVENTION

The present invention relates to a semiconductor laser device wherein an inclined plane formed in a mounting body acts as a reflective mirror to emit light in a direction that is perpendicular to the mounting surface, which solves the above described problem in that the amount of light that is absorbed before it reaches a light-detecting layer (depletion layer) is strongly dependent on diffusion depth by a suitable combination of the materials of the semiconductor laser and the mounting body substrate.

The present invention solves the above described problem by forming a pin-type photodiode on an inclined plane that forms a half-mirror for a mounting body that supports a semiconductor laser element, and also ensuring that the light beam is input to a light-detecting layer made of substantially intrinsic semiconductor with low impurity (i-type layer) without passing through the impurity-diffused layer, by forming the insulation layer on outer surface of the inclined plane.

This invention provides a semiconductor laser device that comprises a mounting body having a step including an upper level, a lower level and an inclined plane provided between the upper and lower levels; and a semiconductor laser element mounted on the lower level, the mounting body further having a pin-type photodiode including a region of a first conduction type, an i-type region and a region of a second conduction type, a portion of laser beam emitted from the laser element being reflected by the inclined plane and output therefrom, a remainder of the laser beam emitted from the laser element being incident into the mounting body through the inclined plan and detected by the photodiode, the i-type region of the photodiode being provided on the inclined plane so that a major part of the reminder of the laser beam can enter the i-type region without passing the region of a first conduction type and the region of a second conduction type of the photodiode.

This invention also provides a semiconductor laser device comprising: a mounting body; and a semiconductor laser element mounted on a major plane of the mounting body, the laser element emitting a laser beam in a direction substantially parallel to the major plane, the mounting body having a pin-type photodiode including a region of a first conduction type, an i-type region and a region of a second conduction type, a major portion of the laser beam emitted from the laser element being incident to an inclined plane of the i-type region, a first part of the laser beam reflected by the inclined plane being output therefrom in a direction substantially normal to the major plane of the mounting body, a second part of the laser beam entering the i-type region through the inclined plane being detected by the pin-type photodiode.

This invention also provides a semiconductor laser device comprising: a semiconductor substrate of a first conduction type, a semiconductor laser element mounted on the substrate, an absorbing layer with low impurity provided in front of a light emitting surface of the laser element, and a semiconductor region of a second conduction type provided on the absorbing layer, the absorbing layer having a lower impurity level than the substrate and the semiconductor region, a major portion of a laser beam emitted from the light emitting surface of the laser element being incident to an inclined plane of the absorbing layer, a first part of the laser beam reflected by the inclined plane being output therefrom, a second part of the laser beam entering the absorbing layer through the inclined plane being detected by a pin-type photodiode, the photodiode including the substrate, the absorbing layer and the semiconductor region.

The present invention reduces light absorption, without contributing to the photo current, and also ensures there is no dependency on diffusion depth by a configuration that ensures that a light beam is input to a light-detecting region (i-type layer) without passing through a diffusion layer, by forming a pin-type photodiode on an inclined plane on which is formed a half-mirror film of a mounting body on which a semiconductor laser device is mounted, then forming the i-type layer on the outer surface of the inclined plane. This makes it possible to provide a semiconductor laser device with an attached FAPC monitoring photodiode that is compact, can be integrated together with another signal-receiving photodiode and has a highlight-detecting efficiency.

BRIEF DESCRIPTION OF THE DRAWINGS

The present invention will be understood more fully from the detailed description given herebelow and from the accompanying drawings of preferred embodiments of the invention. However, the drawings are not intended to imply any limitation of the invention to a specific embodiment, but are for explanation and understanding only.

In these drawings.

DETAILED DESCRIPTION OF PREFERRED EMBODIMENTS

Preferred embodiments of the present invention will be described below with reference to the accompanying drawings.

Figure 1:
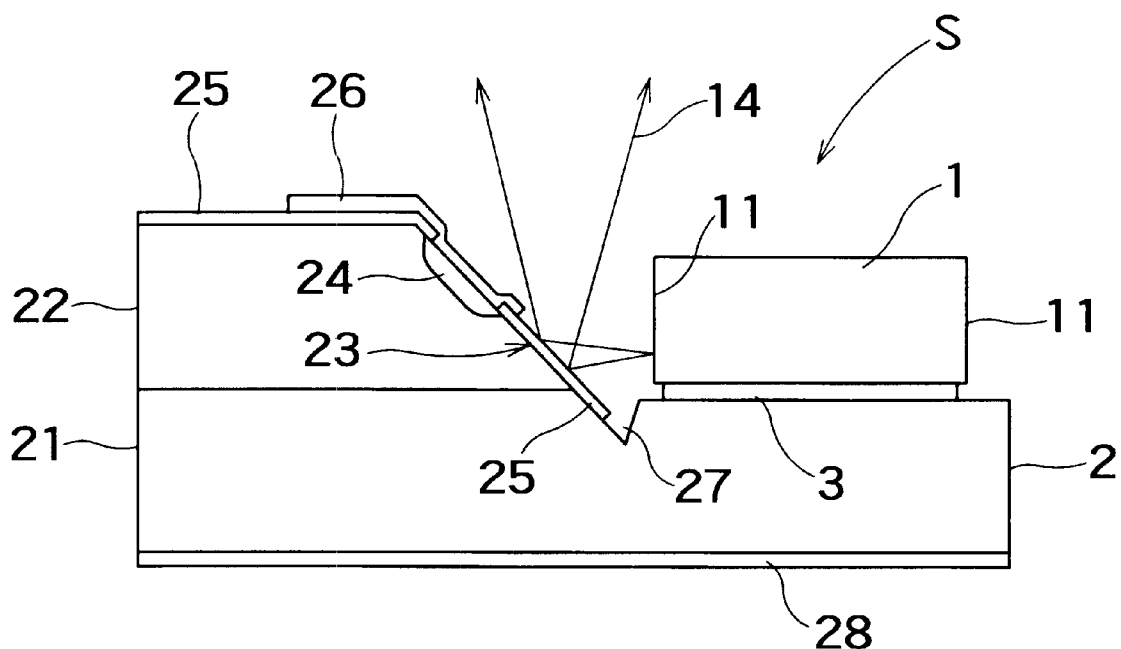
FIG. 1 shows a view of a first embodiment of the invention.

A cross-sectional view of a first embodiment of the present invention is shown in FIG. 1. In this figure, reference number 1 denotes a semiconductor laser element which is an edge-emitting type of laser that emits light from an end facet 11, having a resonator aligned to the left and right in the figure. Reference number 2 denotes a mounting body consisting of a layer 22 of a low impurity concentration that is formed by a method such as epitaxial growth on an n-type conductive substrate 21 that is made of a material such as silicon (Si) and doped with a high concentration of an impurity.

A step S is formed therein by means such as anisotropic etching. That is, the mounting body 2 has a lower level, a upper level and an inclined plane 23 therebetween. The laser element 1 is mounted on the lower level.

A p-type conductive region 24 that has been doped with a high concentration of an impurity is formed in part of the inclined plane 23 of the step S, by means such as thermal diffusion or ion implantation. The region 24, layer 22 and substrate 21 together configure a pin-type photodiode. Reference number 26 denotes a p-side electrode of the photodiode, with a reverse bias voltage being applied between that electrode and a rear electrode 28 (n-side electrode).

The semiconductor laser element 1 is mounted on the lower level of the step S by an electrically conductive adhesive 3 that is solder or the like; part of emitted light 14 thereof is reflected by a semi-transparent film 25 formed on the inclined plane 23 of a dielectric material and is output in the upward direction from the substrate 21; and the part of the light that has passed therethrough is absorbed within a depletion layer that extends within the low-concentration layer 22, to form a photo current. In FIG. 1, a groove 27 is formed on the lower level between the inclined plane 23 and the laser element 1. By providing such a groove 27, the output light beam may not be obstructed by the lower level of the step S, even when the light-emitting portion (in other words, an active layer) of the semiconductor laser element 1 is at a position that is comparatively close to the mounting plane (lower level) of the step S (this is often called "junction-down mounting").

The configuration shown in FIG. 1 is implemented as described below. First of all, a wafer, on which the low-concentration layer 22 has been formed by a method such as epitaxial growth on the high-concentration substrate 21, is patterned by using a method such as photolithography with an oxide film or a nitride film, then this film is used as a mask for the etching of the step by a liquid such as KOH until the substrate 21 is reached.

In this case, the use of an anisotropic etching liquid such as KOH makes it possible to ensure that the inclined plane of the step S is along a predetermined crystal plane, making it possible to obtain a flat surface. The high-concentration region 24 is subsequently formed by ion implantation or thermal diffusion in part of the inclined plane. After the film 25 has been formed of a dielectric material as a half-mirror, the electrode 26 for extraction from the photodiode and the rear surface electrode 28 are formed, then the chip is cut out by means such as dicing.

According to the invention, it is ensured that the emitted light is directly incident on the depletion region, which is a light-detecting region, without passing through the p-type conductive region 24, which is a high-concentration diffusion layer, making it possible to increase the quantum efficiency without inducing undesired light absorption at the region 24.

Note that the above embodiment of the invention relates to a substrate of n-type conductivity, but a similar configuration could of course be obtained with a substrate of p-type conductivity, if the conductivity types are reversed.

Figure 2:
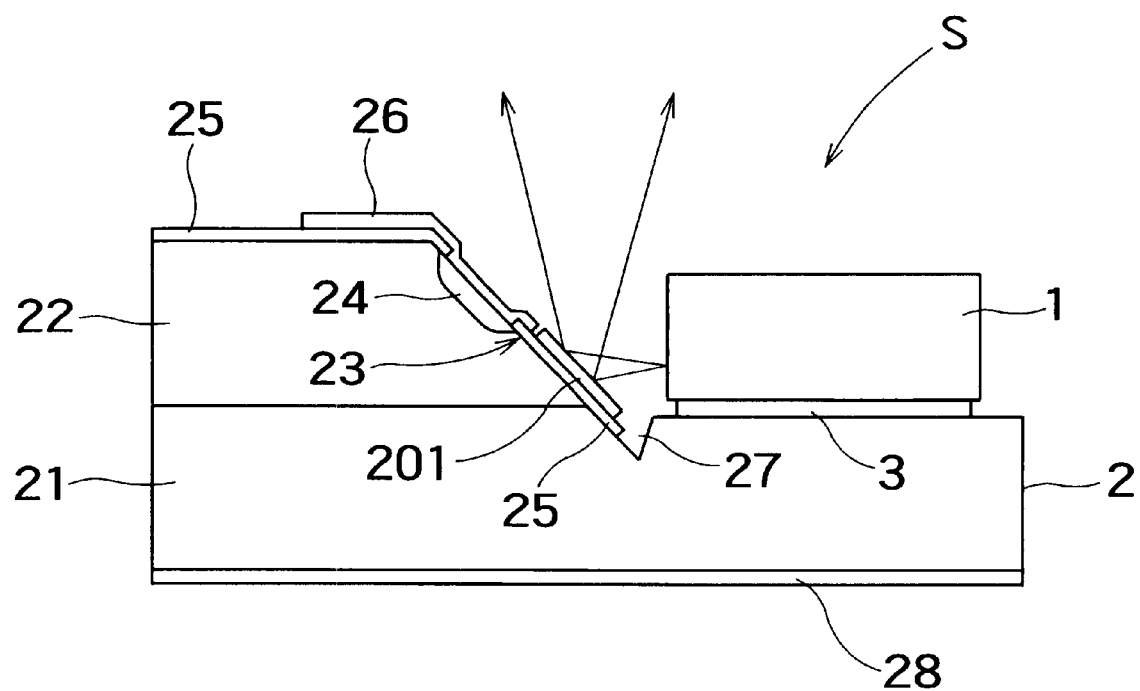
FIG. 2 shows a view of another implementation of the first embodiment of the invention.

The semi-transparent film 25 of this embodiment also acts as an insulating film between the electrode 26 and the layer 22, but it is also possible to form a multi-layer structure with a separately-provided semi-transparent film 201 formed of a thin metal film or a dielectric film, as shown in FIG. 2, which enables the formation of a semi-transparent film with controllable reflectivity. Since control over the reflectivity can be performed separately in such a case, the electrical capacitance and the reflectivity of the electrodes can each be set to optimal values.

Figure 3:
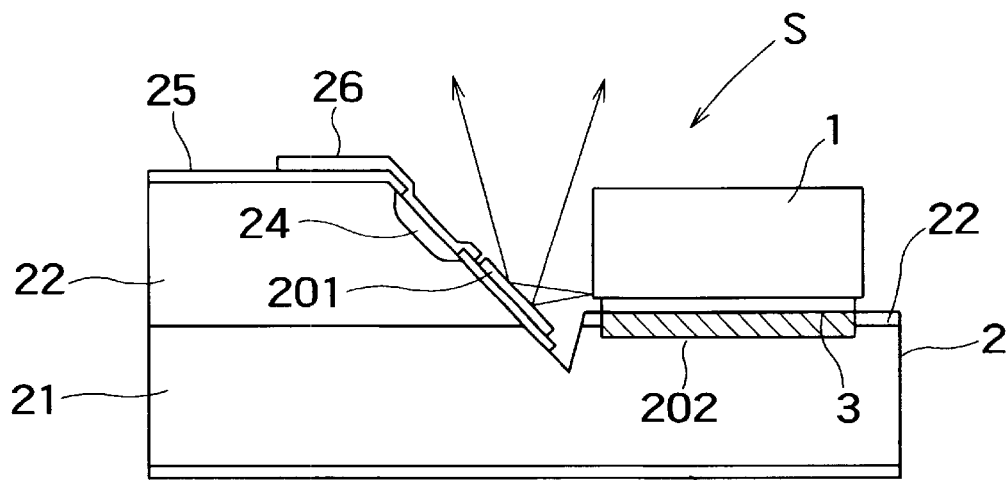
FIG. 3 shows a view of yet another implementation of the first embodiment of the invention.

In the above described embodiment, the lower level of the step S is leveled down to the high-concentration n-type conductive substrate 21, however, it is also possible to level it within the i-type low-concentration layer 22, as shown in FIG. 3. In such a case, the lower level of the step S is a layer with low impurities, ensuring that crystal defects are comparatively rare and thus making it possible to form a flat mounting portion.

If the semiconductor laser element 1 is mounted directly on the i-type layer 22 in this configuration, the mounting surface will have a high resistance and it will be substantially impossible for the mounting body 2 itself to act as one electrode of the semiconductor laser element 1.

In that case, it is possible to make the substrate 21 act as one of the electrodes by forming a high-concentration n-type conductive region 202 to lower this resistance, as shown in FIG. 3. This makes it possible to use the mounting body substrate 21 as a common electrical contact surface when installing elements to form two electrodes on the upper and lower surfaces of a semiconductor laser substrate, such as that of a commercial semiconductor laser, enabling installation without the addition of undesired electrical capacitance.

In addition, a region of high conductivity makes it possible to increase the effective thermal conductivity, so that the heat generated by the semiconductor laser element 1 can be efficiently transferred to the mounting body substrate 21. Note that if the substrate 21 is of p-type conductivity, it should be obvious that it is preferable that the conductivity type of the high-concentration conductive region 202 is also p-type, to ensure that an undesired p-n junction is not formed.

Figure 4:
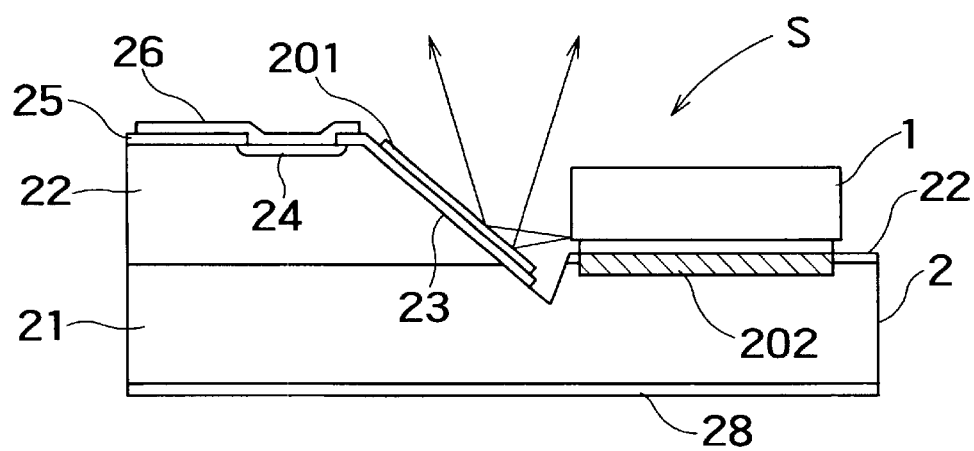
FIG. 4 shows a view of a fourth implementation of the first embodiment of the invention.

In the embodiments described so far with reference to FIGS. 1 to 3, the high-concentration p-type conductive region 24 is formed on the inclined plane, but it could also be formed on the top surface of the mounting body 2, as shown in FIG. 4. Since it is formed on a flat top surface in such a case, it is possible to apply the conditions for diffusion or ion implantation that are used in the fabrication of VSLIs, with substantially no change of the process.

In addition, it becomes not always necessary to create the step S first, as described with reference to FIGS. 1 to 3, which is advantageous in many ways, such as increasing the degree of freedom of processing procedure. It should be noted, however, that it is preferable that the depletion layer, which expands when a predetermined bias voltage is applied to the pin-type configuration in this case, extends as far as the inclined plane 23. It is necessary to be aware that, if it does not extend that far, light that has passed through the semi-transparent film 201 will be absorbed in the region other than the depletion region in the layer 22, causing a decrease in the quantum efficiency.

Figure 5:
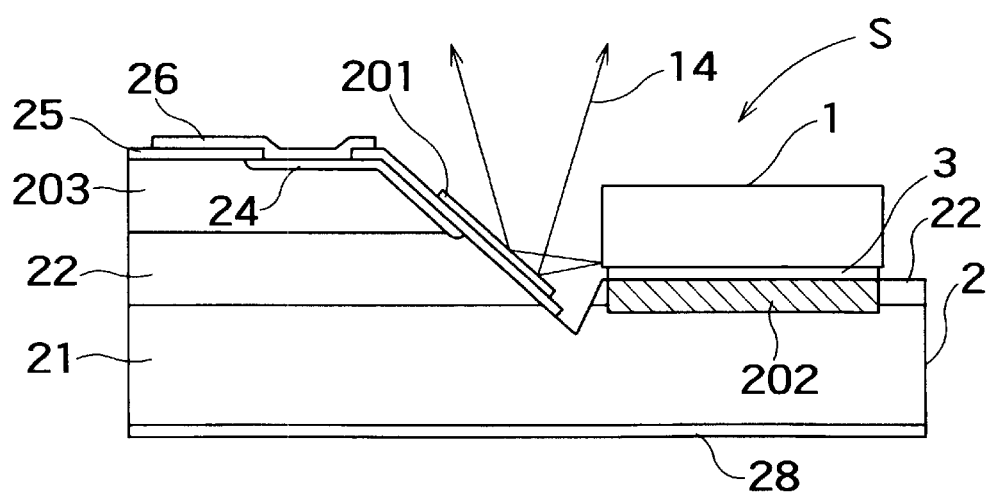
FIG. 5 shows a view of a second embodiment of the invention.

A second embodiment of this invention is shown in FIG. 5. The mounting body 2 has a low-concentration layer (i-type layer) 22 that is formed by a method such as epitaxial growth on top of the high-concentration n-type conductive substrate 21, with an n-type conductive buffer layer 203 formed thereupon by a method such as epitaxial growth. In a similar manner to the first embodiment, after the step S has been formed, the p-type conductive region 24 is formed by high-concentration doping of an impurity by means such as diffusion or ion implantation onto the inclined plane 23 and the top surface of the buffer layer 203.

The light absorbed by the i-type layer 22 creates electron-hole pairs which travel through the depletion layer as far as the high-concentration region 24 and the substrate 21, while being accelerated by an electric field, but the speed of travel within the depletion layer is saturated to a certain degree by factors such as scattering of the crystal matrix. If the mounting body 2 is made of silicon, by way of example, the saturation speed of the carrier is on the order of $1 \times 10^7$ cm/sec. In other words, the time taken to travel through a 30 $\mu$m-thick depletion layer (called the travel time) is on the order of 0.3 nanoseconds, and this travel time is the main factor in bandwidth control with extremely large frequencies. If high-speed response is necessary, therefore, the thickness of the i-type layer imposes restrictions.

It is also preferable that a photodiode for FAPC can receive light efficiently after it has passed through the semi-transparent film, and thus it is preferable that the beam spot is set to close to the center of the i-type layer. In other words, if the i-type layer is controlled to be 30 $\mu$m and the optical axis is set to a depth of 15 $\mu$m within the i-type layer, by way of example, the angle $\theta$ from the optical axis of the light beam that can be reflected from the inclined plane is given by the equation below, where d $\mu$m is the distance betweenthe semiconductor laser device and the inclined plane and $\theta 1$ is the angle between the inclined plane and the substrate surface:

$$\tan(\theta) \leq \frac{15}{15 \tan(\theta 1) + d} \qquad (1)$$

Thus part of the upwardly expanding light beam is not reflected by the inclined plane and is therefore lost.

In contrast thereto, the provision of the buffer layer in the configuration of FIG. 5 makes it possible for the light beam expanding upward from the i-type layer to be reflected by the reflective mirror on top of the buffer layer, thus enabling an increase in the area of the inclined plane that reflects the light beam emitted from the semiconductor laser element 1, with no loss of frequency characteristics, which makes it possible to provide a semiconductor laser device that enables a higher utilization ratio of the output light and also a higher level of integration.

Figure 6:
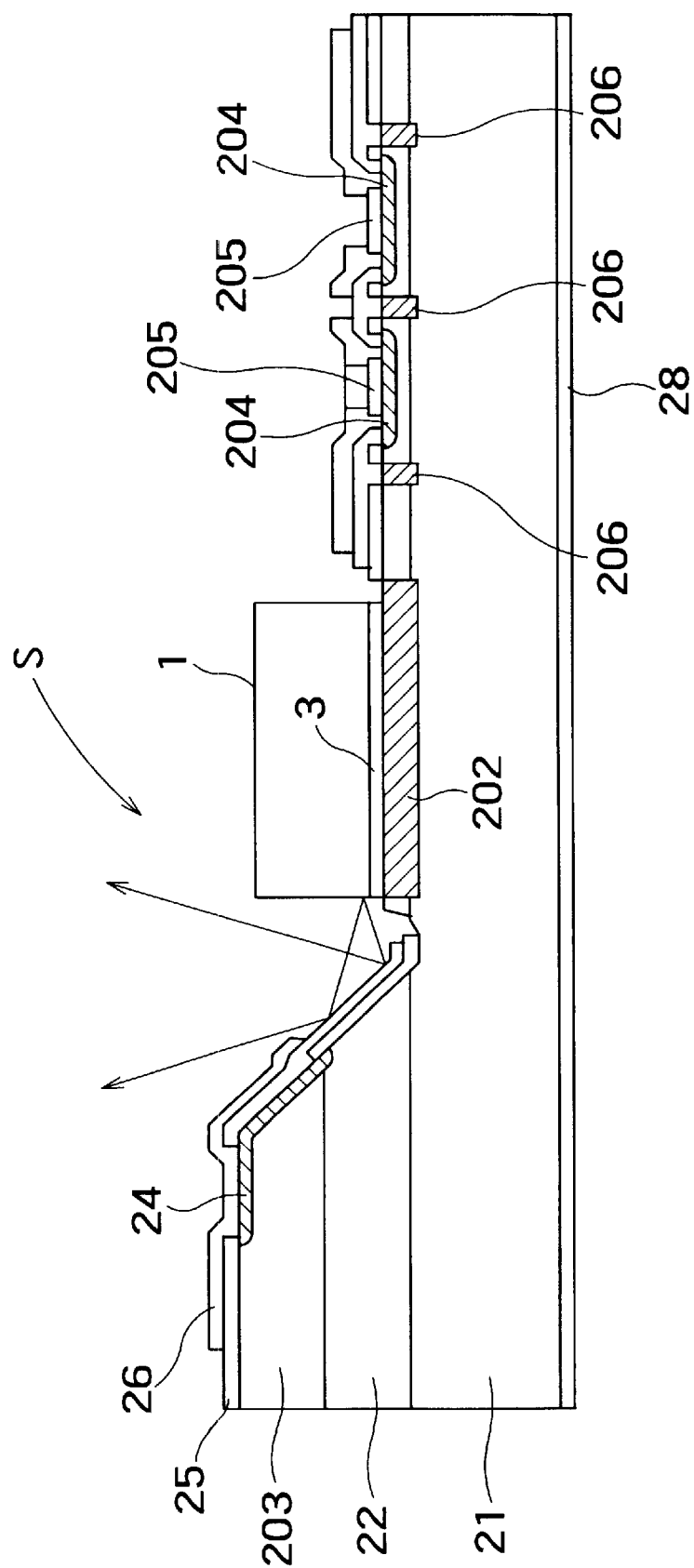
FIG. 6 shows a view of an integrated semiconductor device, illustrating the second embodiment of the invention.

In addition, use of the configuration of FIG. 5 is effective for integrating a signal-receiving surface-incident photodiode that is not an FAPC photodiode, as described previously with respect to the prior art. In other words, an example of the integration of a signal-receiving photodiode within a mounting body is shown in FIG. 6, as an example of an application that is not an FAPC photodiode. In this case, reference num 204 denotes a high-concentration p-type conductive layer, 205 denotes are anti-reflection film, and 206 denotes high-concentration n-type conductive regions that are formed to separate the light-detecting element. The regions 206 are formed with the objective of increasing the conduction and thermal radiation characteristics, and they can be formed simultaneously with the n-type conductive region 202.

With a surface-incident photodiode in this case, only light that has passed through the high-concentration p-type conductive layer 204 and into the depleted layer forms a photo current for signal output, as previously described with reference to the prior-art examples, but there are large losses if the wavelength of the light that is input thereto is one that is absorbed by the mounting body substrate. It is therefore necessary to make the p-type layer as thin as possible. In the example shown in FIG. 6, the provision of this p-type layer 204 ensures that the only dependency on diffusion thickness is that of the flat-surface-incident photodiode formed on the flat surface, making it possible to provide a configuration that can improve controllability and thus restrain losses due to optical absorption.

Figure 7:
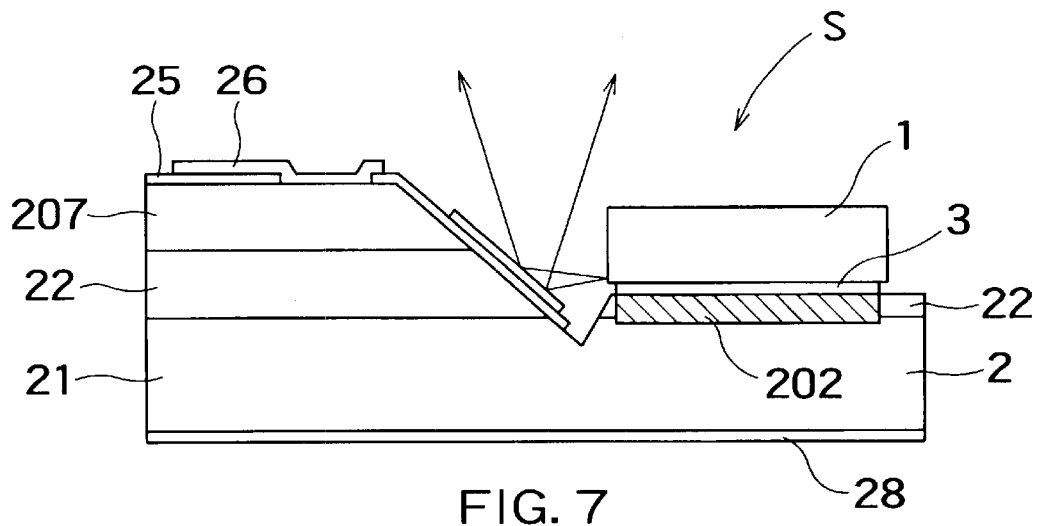
FIG. 7 shows a view of a third embodiment of the invention.

A third embodiment of this invention is shown in FIG. 7. The mounting body 2 has a low-concentration layer (i-type layer) 22 that is formed by a method such as epitaxial growth on top of the high-concentration n-type conductive substrate 21, in a similar manner to the first embodiment, then a p-type conductive layer 207 is grown thereupon by a method such as epitaxial growth. An electrode for the photodiode is formed by creating a hole in the insulating film 25 to achieve contact with the p-type layer 207. In this example, the processing is much simpler because there is no need to form the p-type conductive region frombehind, by a method such as diffusion or ion implantation.

Figure 8:
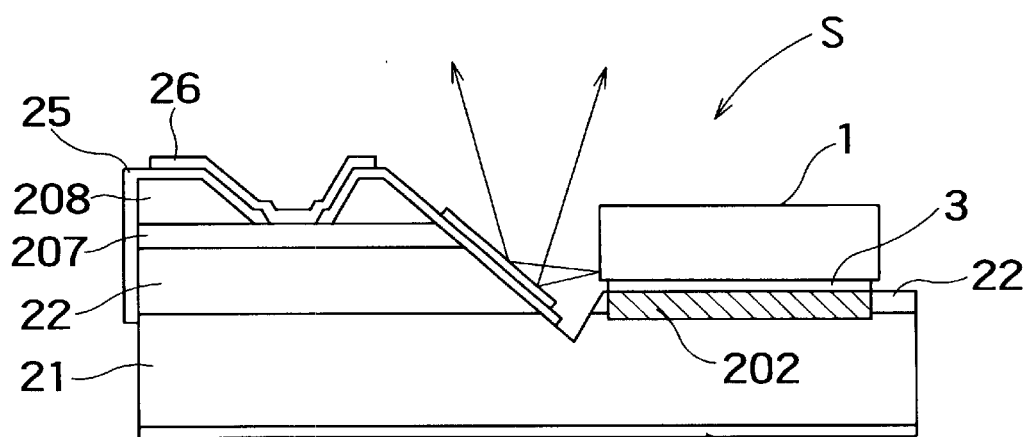
FIG. 8 shows a view of another implementation of the third embodiment of the invention.
Figure 9:
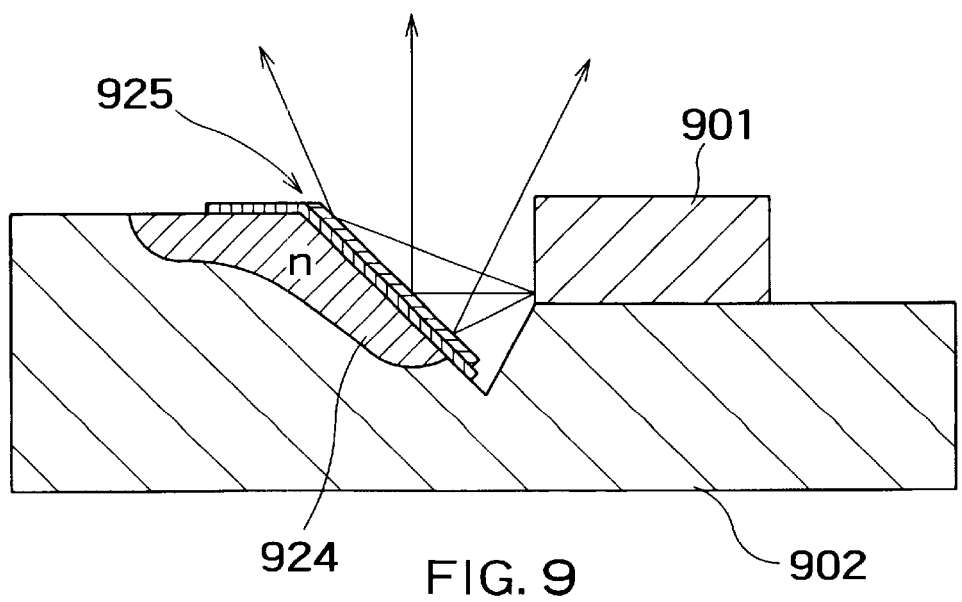
FIG. 9 shows a view of a semiconductor laser device of the prior art.
Figure 10A:
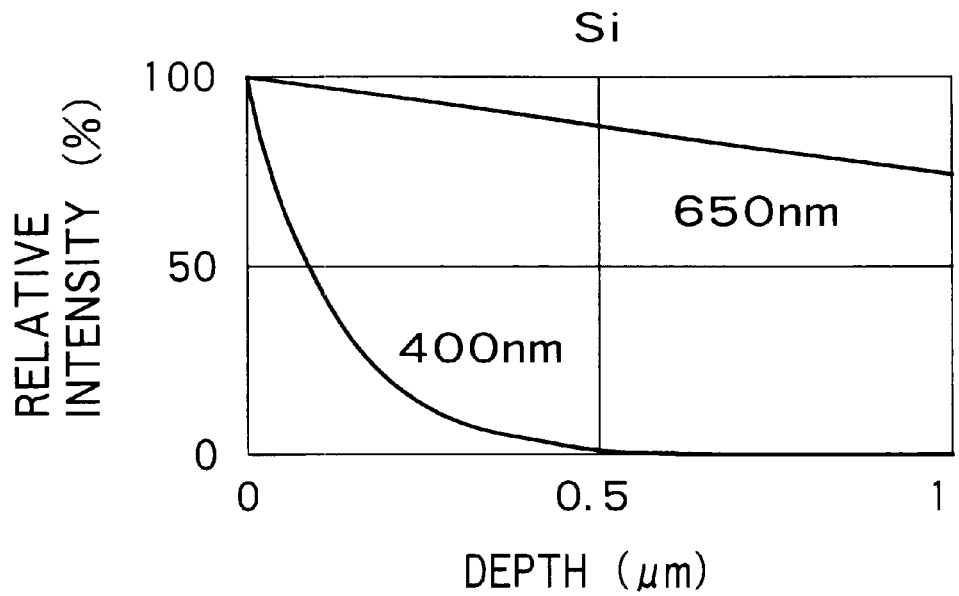
FIGS. 10A and 10B are graphs showing the relationship of depth of crystal and relative intensity of the transmitted light into the crystal.
Figure 10B:
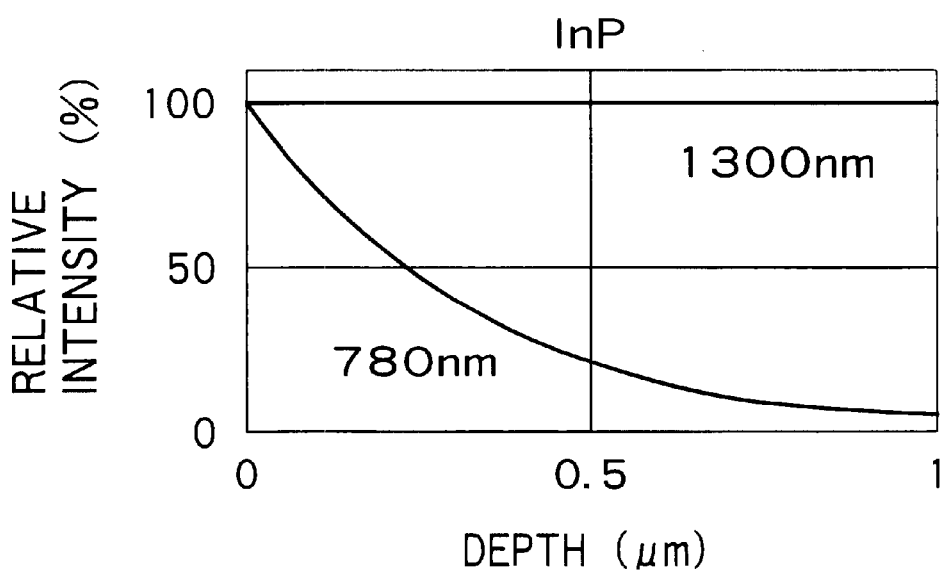

A further example is shown in FIG. 8, where an n-type conductive layer 208 is provided as a buffer layer on top of the p-type layer 207 of FIG. 7 and the electrode for the photodiode is formed by removing part of this buffer layer. In this case, the high-concentration p-type conductive layer 207 can be made thinner than in the example shown in FIG. 7. Since epitaxial growth is used, it is possible to control the film thickness more strictly. This configuration is effective for when there is a surface-incident type of light-detecting element as shown in FIG. 6. Since this configuration also enables the formation of a thin p-type conductive layer, in a similar manner to the previous embodiment, and also enables an increase in the area of the inclined plane that reflects the light beam emitted from the semiconductor laser element 1, with no loss of high-frequency characteristics, it makes it possible to provide a semiconductor laser element that enables an increase in the utilization efficiency of output light and also integration with other devices.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The entire disclosure of Japanese Patent Application No. H11-186552 filed on Jun. 30, 1999 including specification, claims, drawings and summary is incorporated herein by reference in its entirety.

What is claimed is:

1. A semiconductor laser device comprising:
   a mounting body having a step including an upper level, a lower level and an inclined plane provided between said upper and lower levels;
   a semiconductor laser element emitting laser beam, said semiconductor laser element mounted on said lower level,
   said mounting body further having a pin-type photodiode under said upper level, said pin-type photodiode including a region of a first conductivity type, and i-type region formed on said region of first conductivity type and a region of second conductivity type formed in part of a surface of said i-type region, said lower level being located at a surface of the region of said first conductivity type, said inclined plane and said upper level being located at the surface of said i-type region, said inclined plane configured to receive said laser beam from said semiconductor laser element;
   one part of said laser beam emitted from said laser element being reflected by said inclined plane and being emitted to an upper direction as output light; and
   another part of said laser beam being incident on said i-type region through said inclined plane and being detected by said pin-type photodiode.

2. The semiconductor laser device according to claim 1, wherein a semi-transparent film is provided on said inclined plane.

3. The semiconductor laser device according to claim 1, wherein a groove is provided on said lower level between said inclined plane and said laser element.

4. The semiconductor laser device according to claim 1, wherein said region of said second conductivity type is provided on said inclined plane.

5. The semiconductor laser device according to claim 1, wherein said region of said second conductivity type is provided on a top surface of said i-type region.

6. The semiconductor laser device according to claim 1, wherein said mounting body further has a second photodiode provided on said lower level.

7. A semiconductor laser device comprising:
   a mounting body having a step including an upper level, a lower level and an inclined plane provided between said upper and lower levels;
   a semiconductor laser element mounted on said lower level and configured to receive a laser beam,
   said mounting body including a pin-type photodiode under said upper level, said pin-type photodiode having a region of a first conductivity type, an i-type region formed on said region of said first conductivity type, and a region of a second conductivity type formed on said i-type region, said lower level being located at a surface of said first conductivity type, said inclined plane being located at a side surface of said i-type region, said upper level being located at an upper surface of said second conductivity type, said inclined plane configured to receive said laser beam from said semiconductor laser element; and
   wherein one part of said laser beam emitted from said laser element being reflected by said inclined plane and being emitted to an upper direction as output light, and the other part of said laser beam incident into said i-type region through said inclined plane and being detected by said pin-type photodiode.

8. The semiconductor laser device according to claim 7, comprising a semi-transparent film provided on said inclined plane.

9. The semiconductor laser device according to claim 7, wherein said mounting body comprises a groove provided on said lower level between said inclined plane and said laser element.

10. A semiconductor laser device comprising:
    a mounting body having a mounting plane; and
    a semiconductor laser element mounted on said mounting plane of said mounting body,
    said laser element emitting a laser beam in a direction substantially parallel to said mounting plane, said mounting body including a pin-type photodiode having a region of a first conductivity type, an i-type region, and a region of a-second conductivity type, said i-type region being formed on said region of said first conductivity type, said region of said second conductivity type being formed in part of a surface of said i-type region by diffusion or ion implantation, said i-type region having an inclined plane, said laser beam emitted from said laser element being incident on said inclined plane of said i-type region, a portion of said laser beam reflected by said inclined plane being output therefrom in a direction substantially normal to said mounting plane of said mounting body, a remainder of said laser beam entering said i-type region through said inclined plane to be detected by said pin-type photodiode.

11. The semiconductor laser device according to claim 10, wherein a semi-transparent film is provided on said inclined plane.

12. The semiconductor laser device according to claim 10, wherein a groove is provided on said major plane between said inclined plane and said laser element.

13. The semiconductor laser device according to claim 10, wherein said region of said second conductivity type is provided on said inclined plane.

14. The semiconductor laser device according to claim 10, wherein said region of said second conductivity type is provided on a top surface of said i-type region.

15. A semiconductor laser device according to claim 10 wherein said mounting body further has a second photodiode provided on said mounting plane.

16. A semiconductor laser device comprising:

a mounting body having a mounting plane; and a semiconductor laser element mounted on said mounting plane of said mounting body, said laser element emitting a laser beam in a direction substantially parallel to said mounting plane, said mounting body including a pin-type photodiode having a region of a first conductivity type, an i-type region and a region of a second conductivity type, said i-type region being formed on a said region of said first conductivity type, said region of said second conductivity type being formed on said i-type region, said i-type region having an inclined plane, said laser beam emitted from said laser element being incident on said inclined plane of said i-type region, a first part of said laser beam reflected by said inclined plane being output therefrom in a direction substantially normal to said mounting plane of said mounting body, a second part of said laser beam entering said i-type region through said inclined plane is detected by said pin-type photodiode.

17. The semiconductor laser device according to claim 16, wherein said mounting body comprises a semi-transparent film provided on said inclined plane.

18. The semiconductor laser device according to claim 16, said mounting body comprises a groove provided on said mounting plane between said inclined plane and said laser element.

19. A semiconductor laser device comprising:

a mounting body including a pin-type photodiode formed by a semiconductor substrate of a first conductivity type, an i-type semiconductor layer and a region of a second conductivity type, said i-type semiconductor layer being formed on a part of said semiconductor substrate, said region of said second conductivity type being formed in a part of a surface of said i-type semiconductor layer by diffusion or ion implantation, said i-type semiconductor layer having an inclined plane; and a semiconductor laser element mounted on another part of said semiconductor substrate in front of said inclined plane, said semiconductor laser element emitting laser beam toward said inclined plane of said i-type semiconductor layer by injection of driving current, one part of said laser beam being reflected by the inclined plane of said i-type semiconductor layer and being emitted in an upper direction as output light, another part of said laser beam being incident on said i-type semiconductor layer and detected by said pin-type photodiode.

20. The semiconductor laser device according to claim 19, wherein a groove is provided between said inclined plane and said laser element so that said laser beam emitted from said laser element is not obstructed by the plane on which said laser element is mounted.

21. The semiconductor laser device according to claim 19, wherein said p-i-n type photodiode is configured to detect said another part of said laser beam and to impose feed back control on said driving current.

22. A semiconductor laser device comprising:

a mounting body having a pin-type photodiode including a semiconductor substrate of a first conductivity type, an i-type semiconductor layer and a semiconductor layer of a second conductivity type, said i-type semiconductor layer being formed on a portion of said semiconductor substrate, said semiconductor layer of second conductivity type being formed on said i-type semiconductor layer, said i-type semiconductor layer having an inclined plane; and a semiconductor laser element mounted on another portion of said semiconductor substrate in front of said inclined plane, said semiconductor laser element emitting laser beam toward said inclined plane of said i-type semiconductor laser element emitting laser beam toward said inclined plane of said i-type semiconductor layer by injection of driving current, one part of said laser beam being reflected by the inclined plane of said i-type semiconductor layer and being emitted an upper direction as output light, a remainder of said laser beam being incident on said i-type semiconductor layer and by said pin-type photodiode.

23. The semiconductor laser device according to claim 22, wherein said mounting body comprises a groove provided between said inclined plane and said laser element so that said laser beam emitted from said laser element is not obstructed by a plane on which said laser element is mounted.

24. The semiconductor laser device according to claim 22, wherein said p-i-n type photodiode is configured to detect said another part of said laser beam and to impose feed back control on said driving current.

25. A semiconductor laser device comprising:

a mounting body having a step including an upper level, a lower level, and an inclined plane provided between said upper and lower levels;

a semiconductor laser element disposed for emitting a laser beam, said laser element mounted on said lower level;

a p-i-n type photodiode disposed under said upper level, said p-i-n photodiode including a region of a first conductivity type, an i-type layer formed on the region of said first conductivity type, and a region of a second conductivity type formed in a portion of said i-type region, wherein said lower level is located at a surface of the region of said first conductivity type and said inclined plane and said upper level are located at the surface of said i-type region;

a part of said laser beam emitted from said laser element is reflected by said inclined plane as output light, and a remaining part of the laser beam is incident on said i-type region through said inclined plane to be detected by said p-i-n diode; and wherein said inclined plane is arranged so as to receive the laser beam emitted from the laser element.

* * * * *